(12) United States Patent
Deng et al.

(10) Patent No.: US 12,074,163 B2
(45) Date of Patent: Aug. 27, 2024

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Wu Feng Deng, Shanghai (CN); De Biao He, Shanghai (CN); Chang Yong Xiao, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/447,107

(22) Filed: Sep. 8, 2021

(65) Prior Publication Data
US 2021/0398976 A1   Dec. 23, 2021

Related U.S. Application Data

(62) Division of application No. 16/417,255, filed on May 20, 2019, now Pat. No. 11,139,294.

(30) Foreign Application Priority Data

May 21, 2018   (CN) .......................... 201810489354.5

(51) Int. Cl.
*H01L 29/66* (2006.01)
*H01L 21/02* (2006.01)
(Continued)

(52) U.S. Cl.
CPC .... *H01L 27/0886* (2013.01); *H01L 21/02164* (2013.01); *H01L 21/0217* (2013.01); *H01L 21/022* (2013.01); *H01L 21/0228* (2013.01); *H01L 21/823431* (2013.01); *H01L 21/823437* (2013.01); *H01L 21/823481* (2013.01); *H01L 29/0649* (2013.01); *H01L 29/66545* (2013.01);
(Continued)

(58) Field of Classification Search
CPC ....................... H01L 27/2409; H01L 27/2463; H01L 27/224
See application file for complete search history.

(56) References Cited

U.S. PATENT DOCUMENTS

2015/0111350 A1   4/2015   Alptekin et al.
2015/0325575 A1   11/2015  Park et al.
(Continued)

*Primary Examiner* — Trang Q Tran
(74) *Attorney, Agent, or Firm* — Anova Law Group, PLLC

(57) ABSTRACT

Semiconductor structure is provided. The semiconductor structure includes a substrate including device regions and an isolation region located adjacent to and between the device regions; a fin on the substrate; gate structures across the fin at the device regions; source/drain doped regions in the fin at two sides of each of the gate structures; a first opening in the fin at the isolation region; and an insulation structure located in the first opening. Two opposite sidewalls of the first opening are respectively in contact with the source/drain doped regions at adjacent device regions. A top surface of the insulation structure is flush with or higher than top surfaces of the source/drain doped regions.

10 Claims, 9 Drawing Sheets

(51) Int. Cl.
*H01L 21/8234* (2006.01)
*H01L 27/088* (2006.01)
*H01L 29/06* (2006.01)
*H01L 29/78* (2006.01)

(52) U.S. Cl.
CPC ...... *H01L 29/66795* (2013.01); *H01L 29/785* (2013.01)

(56) References Cited

U.S. PATENT DOCUMENTS

| | | |
|---|---|---|
| 2016/0163604 A1 | 6/2016 | Xie et al. |
| 2017/0125305 A1 | 5/2017 | Zhou et al. |
| 2017/0133489 A1* | 5/2017 | Zhou .................... H01L 27/0886 |
| 2018/0108575 A1* | 4/2018 | Li .................... H01L 21/823821 |
| 2018/0138174 A1* | 5/2018 | Min ................ H01L 21/823468 |
| 2018/0261596 A1* | 9/2018 | Jun ..................... H01L 29/0653 |
| 2018/0308769 A1 | 10/2018 | Chang et al. |

\* cited by examiner

SEMICONDUCTOR STRUCTURE AND FABRICATION METHOD THEREOF

CROSS-REFERENCES TO RELATED APPLICATIONS

This application is a divisional of U.S. patent application Ser. No. 16/417,255, filed on May 20, 2019, which claims priority of Chinese Patent Application No. 201810489354.5, filed on May 21, 2018, the entire content of which is hereby incorporated by reference.

FIELD OF THE INVENTION

The present disclosure generally relates to the field of semiconductor manufacturing technology and, more particularly, relates to semiconductor structures and fabrication techniques thereof.

BACKGROUND

As semiconductor devices become more integrated, critical dimensions of a transistor continues to shrink. However, as a dimension of a transistor is drastically reduced, a thickness of a gate dielectric layer and an operating voltage of the transistor may not be changed correspondingly. As such, suppressing short-channel effects may become more difficult, and channel-leakage currents of transistors may be increased.

A gate of a Fin Field-Effect Transistor (FinFET) may have a fork-like 3D structure, similar to a fin. A channel of the FinFET may protrude from a surface of a substrate, forming a fin, and the gate may cover a top surface and sidewalls of the fin. Thus, an inversion layer may be formed at each side of the channel, and circuits may be switched on and off at two sides of the fin.

To meet requirements for further integration of semiconductor devices, distances between adjacent fin field effect transistors may need to be further decreased, resulting in shorter distances between source/drain doped regions of adjacent fin field effect transistors. To avoid bridging between adjacent source/drain doped regions in a fin, an isolation structure may be formed in the fin between the adjacent source/drain doped regions, to electrically isolate the adjacent source/drain doped regions.

However, performances of existing fin field effect transistors may be poor. The disclosed methods and structures are directed to solve one or more problems set forth above and other problems in the art.

BRIEF SUMMARY OF THE DISCLOSURE

One aspect of the present disclosure includes a method for fabricating a semiconductor structure. A substrate including device regions and an isolation region located adjacent to and between the device regions is provided. A fin on the substrate, gate structures across the fin at the device regions, source/drain doped regions in the fin at two sides of each of the gate structures, and a sacrificial gate across the fin at the isolation region are provided. The sacrificial gate and a portion of the fin near a bottom of the sacrificial gate are removed, thus forming a first opening in the fin. An insulation structure in the first opening is formed. Two sides of the sacrificial gate are in contact with the source/drain doped regions at adjacent device regions. A top surface of the insulation structure is flush with or higher than top surfaces of the source/drain doped regions.

Another aspect of the present disclosure includes a semiconductor structure. The semiconductor structure includes a substrate including device regions and an isolation region located adjacent to and between the device regions, a fin on the substrate, gate structures across the fin at the device regions, source/drain doped regions in the fin at two sides of each of the gate structures, a first opening in the fin at the isolation region, and an insulation structure located in the first opening. Two opposite sidewalls of the first opening are respectively in contact with the source/drain doped regions at adjacent device regions. A top surface of the insulation structure is flush with or higher than top surfaces of the source/drain doped regions.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present invention more clear and explicit, the present invention is described in further detail with accompanying drawings and embodiments. It should be understood that the specific exemplary embodiments described herein are only for explaining the present invention and are not intended to limit the present invention.

Reference will now be made in detail to exemplary embodiments of the present invention, which are illustrated in the accompanying drawings. Wherever possible, the same reference numbers will be used throughout the drawings to refer to the same or like parts.

Figure 1:
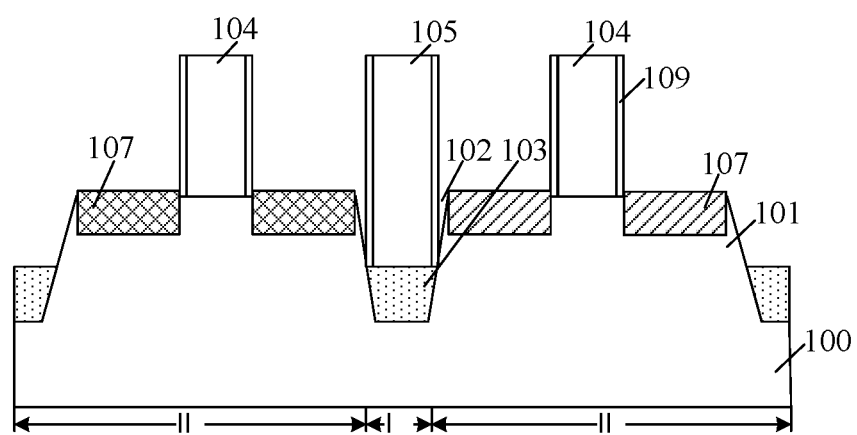
FIG. 1 illustrates a fin field effect transistor.

An existing fin field effect transistor may have poor performances. FIG. 1 illustrates an existing fin field effect transistor. As shown in FIG. 1, the transistor includes a substrate 100, and a fin 101 is disposed on a surface of the substrate. Along an extending direction of the fin 101, the transistor includes an isolation region I and two device regions II respectively located at two sides of the isolation region I. The device regions II are adjacent to the isolated region I, and there is an opening 102 in the fin 101 at the isolation region I. An isolation structure 103 is disposed on the surface of the substrate 100 and in the opening 102. A top surface of the isolation structure 103 is lower than a top surface of the fin 101, and the isolation structure 103 covers a portion of the sidewall of the fin 101. The transistor also includes first gate structures 104 across the fin 101 in the device regions II, and a second gate structure 105 on the top surface of the isolation structure 103. The transistor also includes sidewall structures 109 located at sidewalls of the first gate structures 104 and the second gate structure 105. The transistor also includes source/drain doped regions 107 in the fin 101 at two sides of the first gate structures 104 and the sidewall structures 109.

In the fin field effect transistor shown in FIG. 1, before the isolation structure 103 is formed, the opening 102 is formed in the fin 101 at the isolation region I, and thus the subsequently formed isolation structure 103 is also located in the opening 102. Since the top surface of the isolation structure 103 is lower than the top surface of the fin 101, the subsequent formed second gate structure 105 is located within the opening 102. The second gate structure 105 and the sidewall structure 109 of the second gate structure 105 may isolate devices at the adjacent device regions II. The second gate structure 105 includes a gate layer. A material of the gate layer includes silicon, and a material of the sidewall structure 109 includes silicon nitride. Accordingly, only the sidewall structure 109 is used to electrically isolate the adjacent device regions II.

As the integration degree of a semiconductor device continuously increases, a dimension of the opening 102 in the extending direction of the fin 101 continuously decreases. Accordingly, the sidewall structure 109 at the sidewall of the second gate structure 105 may be in contact with the fin 101 at the device regions II. Further, as the integration degree of a semiconductor device increases, a dimension of the sidewall structure 109 in a direction perpendicular to the sidewall of the first gate structure 104 may continuously decrease. Thus, an isolation capability of the sidewall structure 109 to adjacent source/drain doped regions 107 in the device regions II may be insufficient. Accordingly, mutual interference between adjacent source/drain doped regions 107 at the device regions II may easily occur, and performances of the fin field effect transistor may thus be affected.

To solve the above technical problems, the present disclosure provides a fabrication method for a semiconductor structure. The semiconductor structure includes a substrate including an isolation region and two device regions located at two sides of the isolation region respectively. The device regions are adjacent to the isolation region. The semiconductor structure also includes gate structures across a fin at the device regions, source/drain doped regions in the substrate at two sides of each gate structure, and a sacrificial gate across the fin at the isolation region. Two sides of the sacrificial gate are in contact with the source/drain doped regions at adjacent device regions. The fabrication method includes removing the sacrificial gate and a portion of the fin at the bottom of the sacrificial gate, thus forming a first opening in the fin. The fabrication method also includes forming an insulation structure in the first opening. A top surface of the insulation structure is flush with or higher than top surfaces of the source/drain doped regions. The semiconductor device formed by the method may have good performances.

Figure 2:
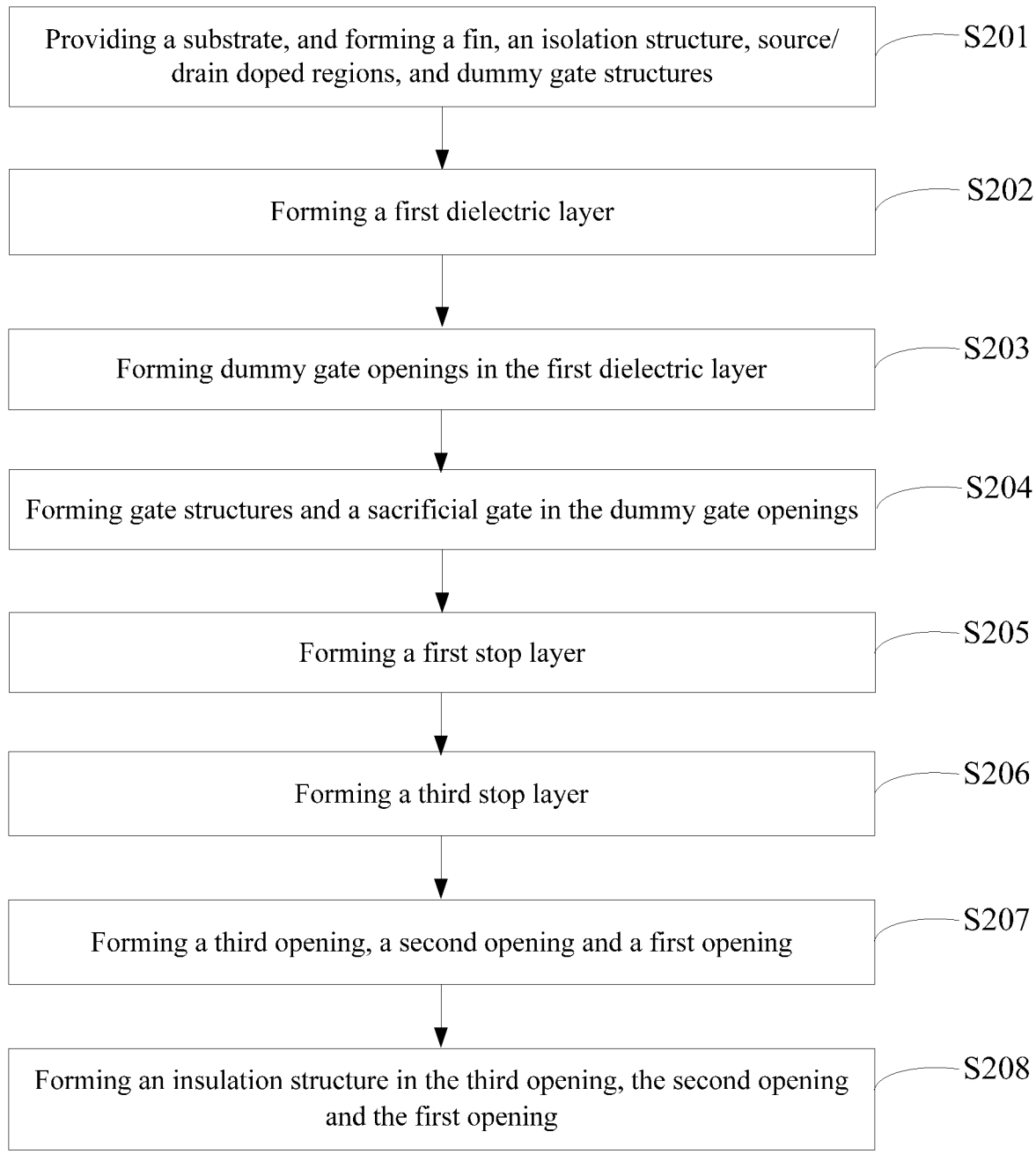
FIG. 2 illustrates an exemplary fabrication process of a semiconductor structure consistent with the disclosed embodiments.

FIG. 2 illustrates an exemplary fabrication process of a semiconductor structure consistent with the disclosed embodiments. FIGS. 3 to 16 illustrate semiconductor structures corresponding to certain stages of the exemplary fabrication process.

The fabrication process includes providing a substrate. The substrate includes an isolation region and two device regions located at two sides of the isolation region respectively, and the device regions are adjacent to the isolation region. Gate structures are disposed on surfaces of the substrate at the device regions, and source/drain doped regions are disposed in the substrate at two sides of each gate structures. A sacrificial gate is disposed on a surface of the substrate at the isolation region.

The gate structures and the sacrificial gate are simultaneously formed, and each of the gate structures and the sacrificial gate includes a gate layer. In one embodiment, a material of the gate layer is metal. A process for forming the gate structures, the sacrificial gate, and the source/drain doped regions is illustrated in FIG. 3 to FIG. 6.

Figure 3:
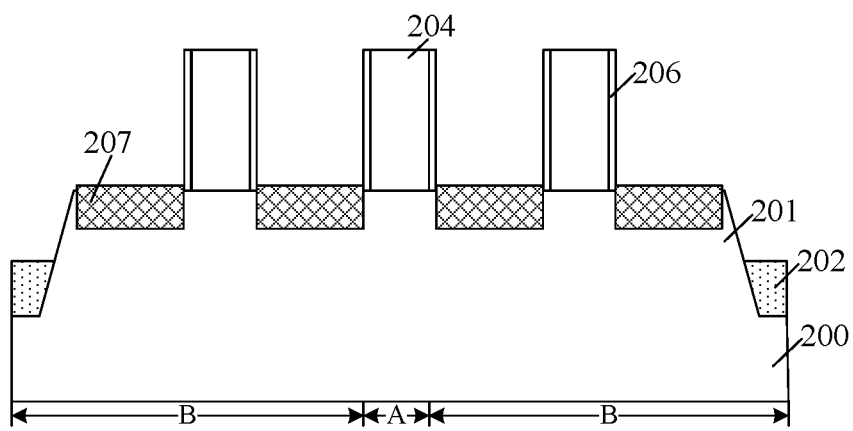
FIGS. 3 to 16 illustrate semiconductor structures corresponding to certain stages of the exemplary fabrication process consistent with the disclosed embodiments.

As shown in FIG. 2, at the beginning of the fabrication process, a substrate is provided, and a fin, an isolation structure, source/drain doped regions and dummy gate structures are formed (S201). FIG. 3 illustrates a corresponding semiconductor structure.

As shown in FIG. 3, a substrate 200 is provided. The substrate 200 includes an isolation region A and two device regions B at two sides of the isolation region A respectively. A surface of the substrate 200 is disposed with a fin 201. The fabrication process also includes forming dummy gate structures 204 across the fin 201 at the device regions B and the isolated the region A, respectively. The fabrication process also includes forming source/drain doped regions 207 in the fin 201 at two sides of each dummy gate structure 204 in the device regions B. The source/drain doped regions 207 in adjacent device regions B are in contact with two sides of the dummy gate structure 204 in the isolation region A, respectively.

A process of providing the substrate 200 and forming the fin 201 includes providing an initial substrate, wherein a mask layer is disposed on a surface of the initial substrate, and the mask layer exposes a portion of the surface of the initial substrate. The process also includes etching the initial substrate, using the mask layer as a mask, to form the substrate 200 and the fin 201 on a surface of the substrate 200.

In one embodiment, a material of the initial substrate includes silicon, and correspondingly, a material of the substrate 200 and the fin 201 includes silicon. In some other embodiments, the material of the initial substrate may include silicon germanium, germanium, silicon on insulator, or germanium on insulator. Correspondingly, the material of the substrate 200 and the fin 201 may include silicon germanium, germanium, silicon on insulator, or germanium on insulator. In some other embodiments, the substrate may be a planar substrate, and the material of the substrate may include silicon, silicon germanium, germanium, silicon on insulator, or germanium on insulator.

A material of the mask layer includes silicon nitride or titanium nitride, and the mask layer may be used as a mask for the substrate 200 and the fin 201. Using the mask layer as the mask, a process of etching the initial substrate may include one or a combination of a dry etching process and a wet etching process.

In one embodiment, isolation structures 202 are disposed on the surface of the substrate 200. Top surfaces of the isolation structures 202 are lower than a top surface of the fin 201, and the isolation structures cover a portion of sidewalls of the fin 201.

A process of forming the isolation structures 202 includes forming an isolation structure film on the surface of the substrate 200, and sidewalls and a top surface of the fin 201, and then removing a portion of the isolation structure film to form the isolation structure. A process of forming the isolation structure film includes a chemical vapor deposition process or a physical vapor deposition process. A process of removing a portion of the isolation structure film includes one or a combination of a dry etching process and a wet etching process.

A material of the isolation structure film may include silicon oxide, silicon oxynitride, or a low-K dielectric material with K less than approximately 3.9. The isolation structure 202 may electrically isolate different semiconductor devices.

The isolation region A may be used to subsequently form an insulation structure. In one embodiment, the device region B on a side of the isolation region A may be used to form an NMOS transistor, and the device region B on the other side of the isolation region A may be used to form a PMOS transistor. In some other embodiments, both device regions at two sides of the isolation region may be used to form PMOS transistors; or both device regions at two sides of the isolation region may be used to form NMOS transistors.

The dummy gate structure 204 includes a dummy gate dielectric layer (not shown) and a dummy gate layer (not shown) on a surface of the dummy gate dielectric layer. A material of the dummy gate dielectric layer includes silicon oxide, and a material of the dummy gate layer includes silicon.

In one embodiment, the dummy gate structures 204 in the device regions B are used to subsequently form gate structures, and the dummy gate structure 204 in the isolation region A is used to subsequently form a sacrificial gate. In some other embodiments, the dummy gate structures in the device regions are gate structures, and the dummy gate structure in the isolation region is a sacrificial gate.

A dimension of the dummy gate structures 204 in a direction perpendicular to the sidewalls of the dummy gate structures 204 is in a range of approximately 20 nm to 34 nm. The dimension of the dummy gate structures 204, along the direction perpendicular to the sidewalls of the dummy gate structures 204, may determine a dimension of a subsequent insulation structure.

Sidewall structures 206 are disposed at the sidewalls of the dummy gate structures 204. The sidewall structures 206 may define locations of the source/drain doped regions 207.

A forming process of the source/drain doped regions 207 includes forming a first photoresist on a surface of the isolation region A. By using the first photoresist as a mask, source/drain openings are formed in the fin 201 at two sides of the dummy gate structures 204 and the sidewall structures 206 in the device regions B. The forming process also includes forming epitaxial layers in the source/drain openings, and doping source/drain ions in the epitaxial layers to form the source/drain doped regions 207.

A material of the epitaxial layers and a conductivity type of the source/drain ions are related to a type of a transistor. Specifically, when the transistor is an NMOS transistor, the material of the epitaxial layer may include silicon carbide or silicon, and the source/drain ions are N-type ions, such as phosphorus ions or arsenic ions. When the transistor is a PMOS transistor, the material of the epitaxial layer may include silicon germanium or silicon, and the source/drain ions are P-type ions, such as boron ions or $BF_2^+$.

In one embodiment, two sides of the dummy gate structure 204 at the isolation gate A are in contact with source/drain doped regions 207 in the adjacent device regions B. As the dummy gate structure 204 at the isolation region A may be subsequently used for forming a sacrificial gate, the sacrificial gate may be in contact with the source/drain doped regions 207 in the adjacent device regions B. Since the sacrificial gate may define a position and a dimension of a subsequent first opening, two sides of the insulation structure located in the first opening may be in contact with the source/drain doped regions 207 in the adjacent device regions B, respectively.

Since a top surface of the insulation structure is flush with or higher than top surfaces of the source/drain doped regions 207, the insulation structure may isolate the source/drain doped regions 207 in the adjacent device regions B. Moreover, since a dimension of the insulation structure along a direction connecting the source/drain doped regions 207 in the adjacent device regions B may be large, the insulation structure may have a strong isolation capability for the source/drain doped regions 207 in the adjacent device regions B. Accordingly, mutual influence between the adjacent device regions B may be weak.

Figure 4:
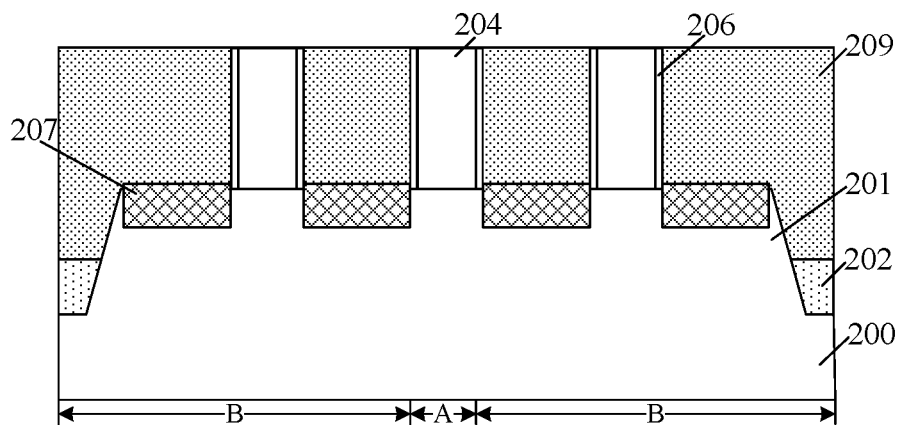

Returning to FIG. 2, a first dielectric layer 209 is formed on surfaces of the isolation structure 202 and the source/drain doped regions 207, sidewalls and top surfaces of the fin 201, and sidewalls of the dummy gate structures 204 (S202). FIG. 4 illustrates a corresponding semiconductor structure.

A process of forming the first dielectric layer 209 includes forming a first dielectric film on the surfaces of the isolation structure 202 and the source/drain doped regions 207, and the sidewalls and top surfaces of the dummy gate structures 204. A portion of the first dielectric film is then removed until the top surfaces of the dummy gate structures 204 are exposed, thus forming the first dielectric layer 209. The first dielectric layer 209 may electrically isolate different semiconductor devices.

A material of the first dielectric film includes silicon oxide, silicon oxynitride or a low-K dielectric material. Correspondingly, a material of the first dielectric layer 209 includes silicon oxide, silicon oxynitride or a low-K dielectric material.

A process of forming the first dielectric film includes a chemical vapor deposition process or a physical vapor deposition process. A process of removing a portion of the first dielectric film includes a chemical mechanical polishing process.

Figure 5:
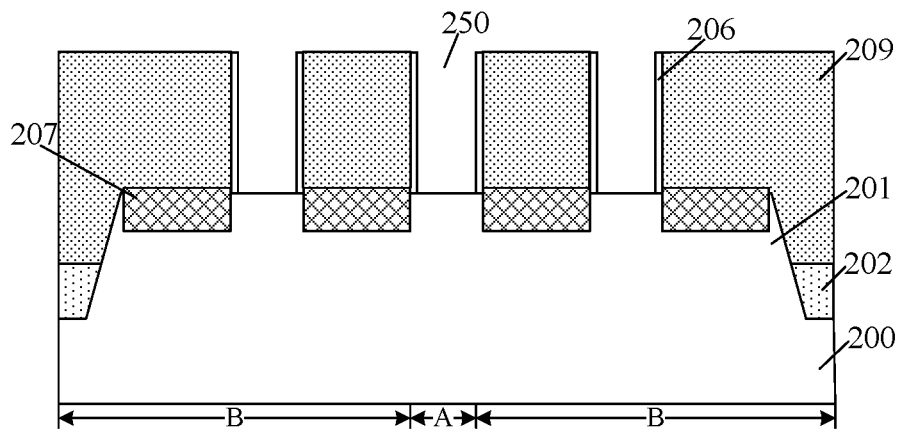

Returning to FIG. 2, the dummy gate structures 204 (see FIG. 4) may be removed, forming dummy gate openings 250 in the first dielectric layer 209 (S203). FIG. 5 illustrates a corresponding semiconductor structure.

Since the first dielectric layer 209 exposes the top surfaces of the dummy gate structures 204, the dummy gate structures 204 may be removed. A process of forming the dummy gate openings 250 includes removing the dummy gate layers, and removing the dummy gate dielectric layer after the dummy gate layers are removed. A process of removing the dummy gate layers includes one or a combination of a dry etching process and a wet etching process. A process of removing the dummy gate dielectric layers includes one or a combination of a dry etching process and a wet etching process.

The dummy gate opening 250 at the isolation region A may subsequently accommodate a sacrificial gate, and the dummy gate openings 250 at the device regions B may subsequently accommodate gate structures.

In a direction perpendicular to sidewalls of the dummy gate structures 204, a dimension of the dummy gate openings 250 is determined by the dimension of the dummy gate structures 204. Accordingly, the dimension of the dummy gate openings 250 along the direction perpendicular to the sidewalls of the dummy gate structures 204 is in a range of approximately 20 nm to 34 nm. The dimension of the dummy gate openings 250 along the direction perpendicular to the sidewalls of the dummy gate structures 204 may determine a width of the subsequent gate structures and a width of the sacrificial gate.

Figure 6:
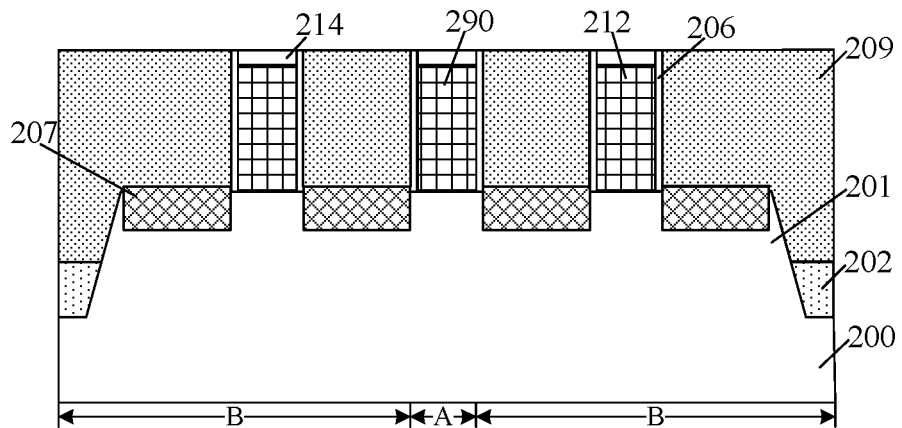

Returning to FIG. 2, gate structures 212 may be formed in the dummy gate openings 250 (see FIG. 5) at the device regions B, and a sacrificial gate 290 may be formed in the dummy gate opening 250 at the isolation region A (S204). FIG. 6 illustrates a corresponding semiconductor structure. The sacrificial gate 290 and the gate structures 212 may be simultaneously formed. The sacrificial gate 290 and the gate structures 212 include a gate dielectric layer (not shown) and a gate layer on a surface of the gate dielectric layer (not shown).

A material of the gate dielectric layer includes a high K material, with K larger than approximately 3.9. In one embodiment, the material of the gate dielectric layer may be $HfO_2$. In some other embodiments, the material of the gate dielectric layer may include $La_2O_3$, HfSiON, $HfAlO_2$, $ZrO_2$, $Al_2O_3$ or $HfSiO_4$. A material of the gate layer may be metal. In one embodiment, the material of the gate layer is tungsten. In some other embodiments, the material of the gate layer includes copper.

After the gate structures 212 are formed, a portion of the gate structures 212 is removed, thus forming stop openings (not shown) on surfaces of the gate structures 212. Then second stop layers 214 are formed in the stop openings. The second stop layers 214 expose a top surface of the first dielectric layer 209.

A process of forming the stop openings includes a wet etching process. A process of forming the second stop layers 214 includes forming a second stop film on the top surface of the first dielectric layer 209 and in the stop openings, wherein the second stop film fully fills the stop openings. The second stop film on the top surface of the first dielectric layer 209 is then removed, forming the second stop layers 214 within the stop openings. A material of the second stop film includes silicon nitride, and correspondingly, a material of the second stop layers 214 includes silicon nitride.

A process of forming the second stop film includes a chemical vapor deposition process or a physical vapor deposition process. A process of removing the second stop film on the top surface of the first dielectric layer 209 includes a chemical mechanical polishing process.

First contact holes may be subsequently formed on surfaces of the gate structures 212 at the device regions B, and the second stop layers 214 may serve as stop layers in a process of forming the first contact holes.

Figure 7:
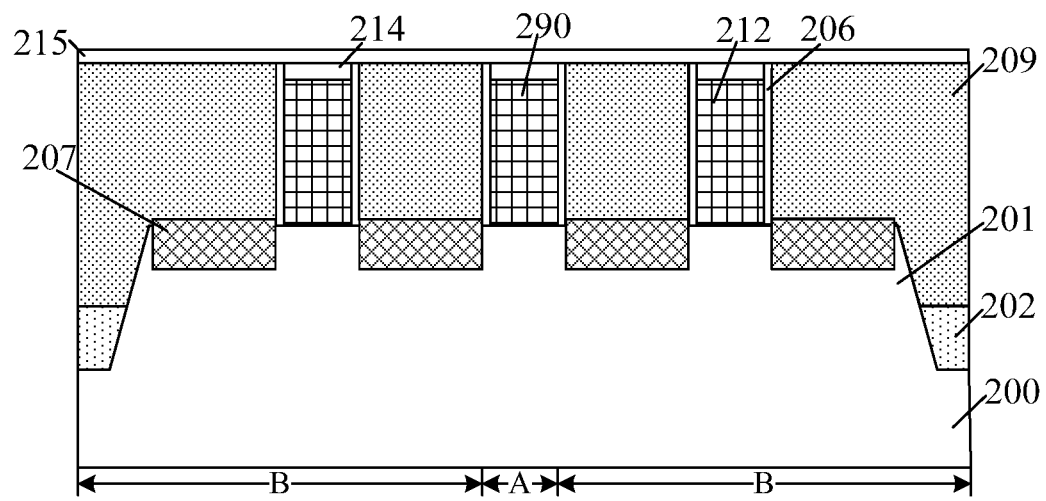

Returning to FIG. 2, a first stop layer 215 may be formed on surfaces of the first dielectric layer 209 and the second stop layers 214 (S205). FIG. 7 illustrates a corresponding semiconductor structure. A material of the first stop layer 215 includes silicon oxide, and a process of forming the first stop layer 215 includes a chemical vapor deposition process or a physical vapor deposition process.

Since a compactness of the second stop film is greater than a compactness of the first dielectric layer 209, recesses may be formed at a top of the first dielectric layer 209 after the chemical mechanical polishing process. Forming the first stop layer 215 may fill the recesses at the top of the first dielectric layer 209, thus improving a flatness of a top surface of the semiconductor device.

Figure 8:
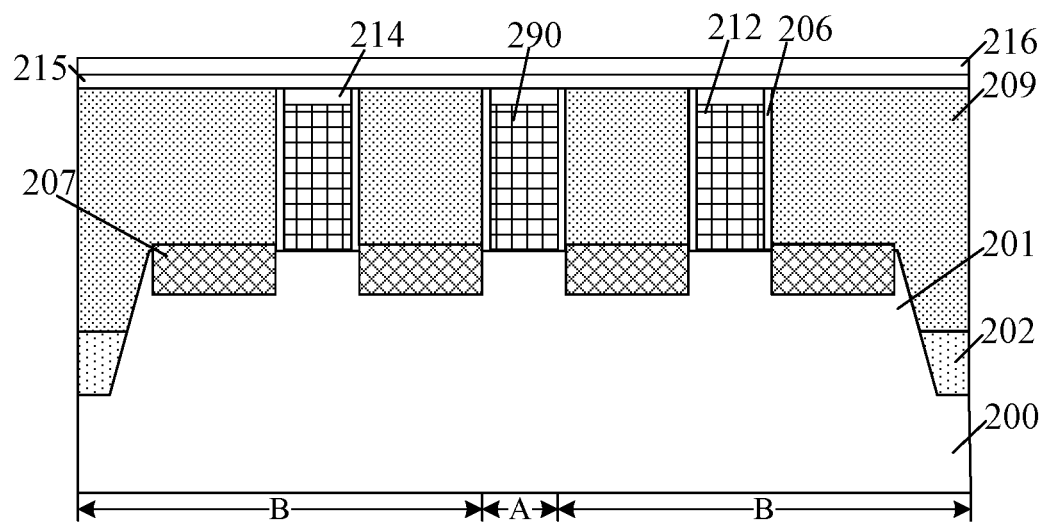

Returning to FIG. 2, a third stop layer 216 may be disposed on a surface of the first stop layer 215 (S206). FIG. 8 illustrates a corresponding semiconductor structure. A material of the third stop layer 216 includes silicon nitride. A forming process of the third stop layer 216 includes a chemical vapor deposition process or a physical vapor deposition process. The third stop layer 216 may be used to subsequently form a stop layer of mask openings in a photoresist.

Figure 9:
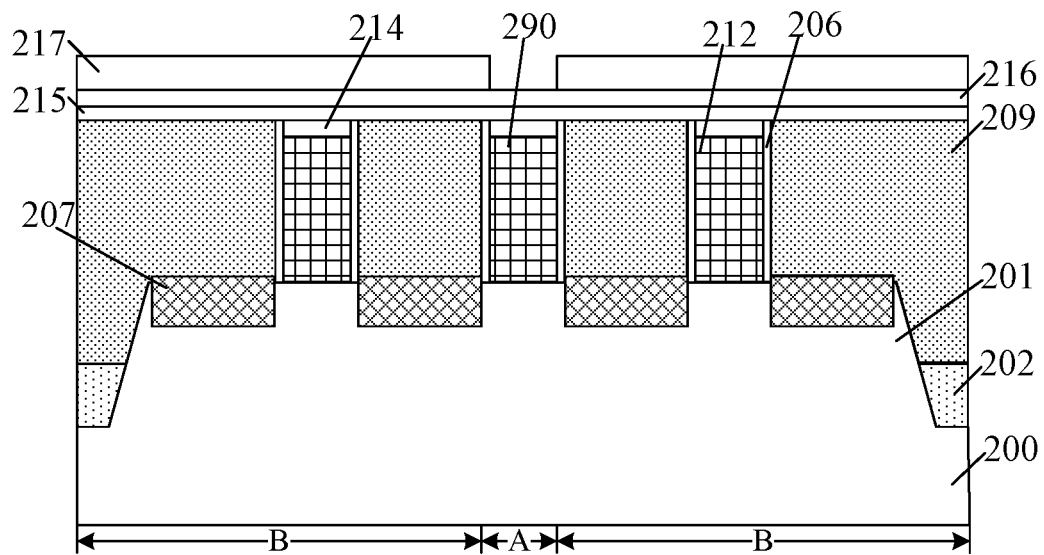
Figure 10:
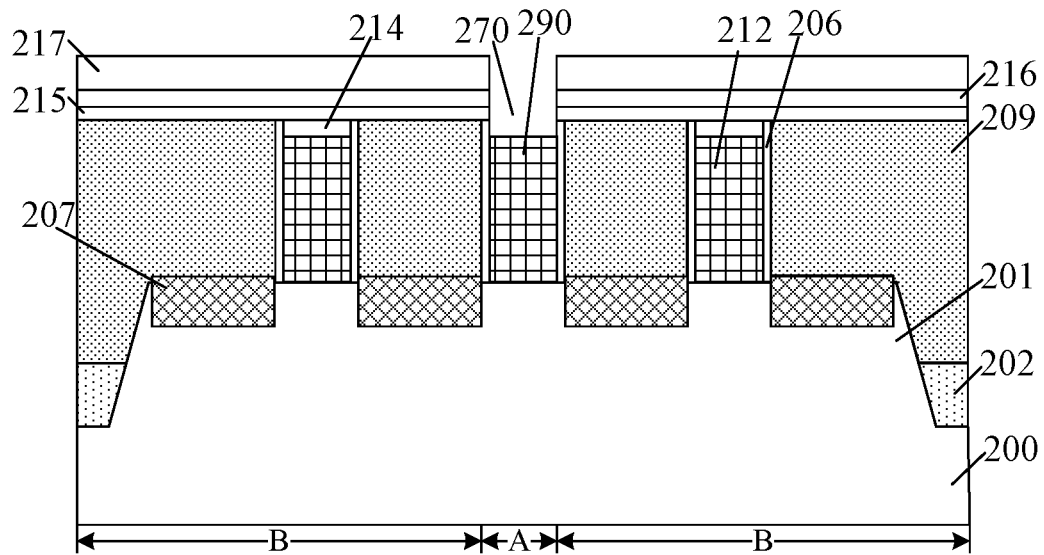
Figure 11:
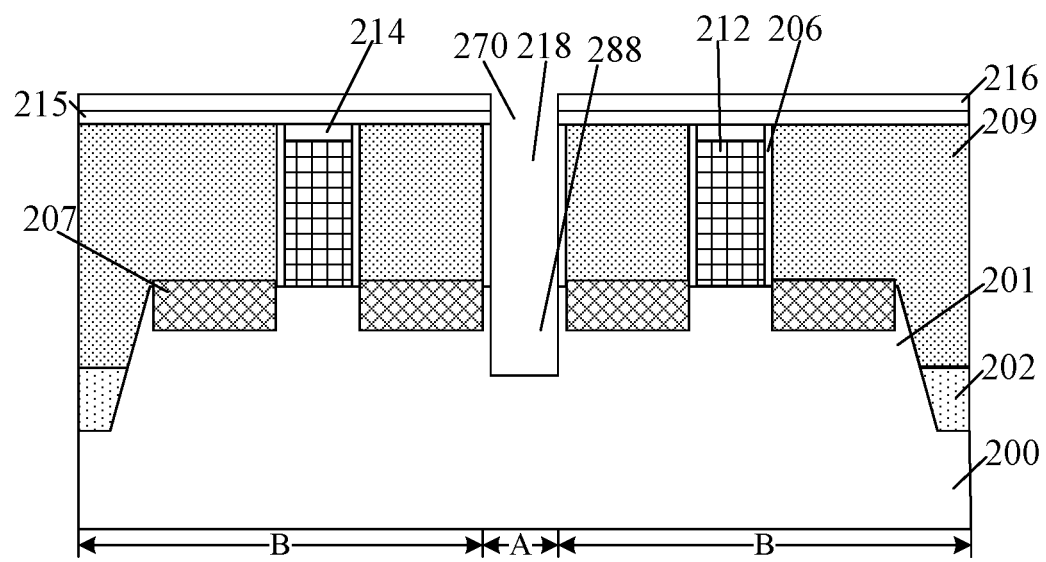

Returning to FIG. 2, a third opening, a second opening and first opening may be formed (S207). FIGS. 9-11 illustrate corresponding semiconductor structures.

Referring to FIG. 9, a photoresist 217 is formed on a surface of the third stop layer 216, and the photoresist 217 has a mask opening (not labelled) exposing the third stop layer 216. The third stop layer 216 may be used to form a stop layer of the mask opening. The photoresist 217 may serve as a mask for removing the second stop layer 214, the first stop layer 215, and the third stop layer 216 on the top surface of the gate structure 212 at the isolation region A.

In the direction perpendicular to the sidewall of the gate structure 212, a dimension of the mask opening is in a range of approximately 20 nm to 34 nm. Since the dimension of the sacrificial gate 290 is in a range of approximately 20 nm to 34 nm, the top of the sacrificial gate 290 may be subsequently exposed, and the sacrificial gate 290 may thus be subsequently removed.

Referring to FIG. 10, using the photoresist 217 as a mask, the third stop layer 216, the first stop layer 215, and the second stop layer 214 are etched until the surface of the sacrificial gate 290 is exposed. A third opening 270 is formed in the first stop layer 215 and the first dielectric layer 209. A process of etching the third stop layer 216, the first stop layer 215 and the second stop layer 214 by using the photoresist 217 as a mask includes one or a combination of a dry etching process and a wet etching process.

The third opening 270 and the subsequently formed first opening and second opening may subsequently accommodate an insulation structure.

Referring to FIG. 11, the sacrificial gate 290 (see FIG. 10) at the bottom of the third opening 270 may be removed, forming a second opening 218 at the bottom of the third opening 270 in the first dielectric layer 209. Further, a portion of the fin 201 at the bottom of the second opening 218 may be removed, forming a first opening 288 in the fin 201.

A process of removing the sacrificial gate 290 (see FIG. 10) at the bottom of the third opening 270 includes one or a combination of a dry etching process and a wet etching process. A process of removing a portion of the fin 201 at the bottom of the second opening 218 includes one or a combination of a dry etching process and a wet etching process.

In the direction perpendicular to the sidewall of the gate structure 212, the first opening 288 has a dimension in a range of approximately 20 nm to 34 nm. If the dimension of the first opening 288 in the direction perpendicular to the sidewall of the gate structure 212 is less than approximately 20 nanometers, a dimension of the subsequent insulation structure may be too small in the direction perpendicular to the sidewall of the gate structure 212. Accordingly, the capability of the insulation structure for isolating devices in the adjacent device regions may be insufficient. If the size of the first opening 288 in the direction perpendicular to the sidewall of the gate structure 212 is greater than approximately 34 nanometers, the integration degree of the semiconductor device may not be improved.

The first opening 288 has a depth in a range of approximately 50 nm to 100 nm. If the depth of the first opening 288 is less than approximately 50 nanometers, isolation performances of the subsequent isolation structure located in the first opening 288 may be insufficient for isolating devices in the adjacent device regions B. If the depth of the first opening 288 is greater than approximately 100 nanometers, the substrate 200 may be pierced.

Returning to FIG. 2, an insulation structure may be formed in the first opening 288, the second opening 218, and the third opening 270 (S208). FIGS. 12-16 illustrate corresponding semiconductor structures.

Figure 12:
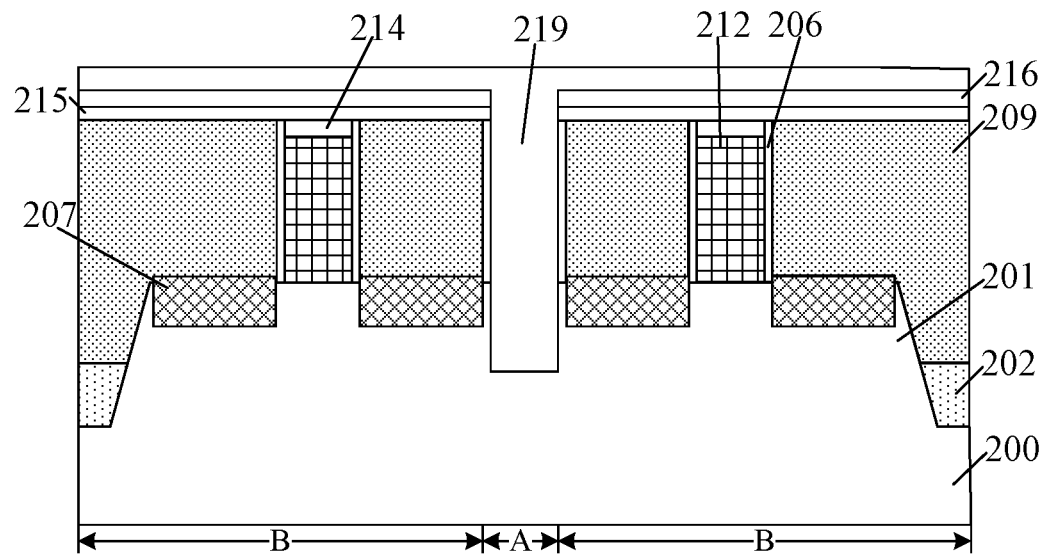

Referring to FIG. 12, a first insulation material film 219 is formed in the first opening 288 (see FIG. 11), the second opening 218 (see FIG. 11), and the third opening 270 (see FIG. 11), and on a surface of the third stop layer 216. A material of the first insulation material film 219 includes silicon oxide, silicon oxynitride, or a low-k dielectric material with K less than approximately 3.9.

In one embodiment, a process of forming the first insulation material film 219 includes a fluid chemical vapor deposition process. In some other embodiments, the process of forming the first insulation material film may include a physical vapor deposition process.

In one embodiment, the first insulation material film 219 formed by a fluid chemical vapor deposition process may have a strong filling ability to the first opening 288, the second opening 218, and the third opening 270. Further, the first insulation material film 219 may have a high compactness. The first insulation material film 219 may be subsequently used to form a first insulation layer, and the first insulation layer may have a high compactness. Accordingly, the first insulation layer may have good isolation performance.

The first insulation material film 219 has a thickness in a range of approximately 50 nm to 100 nm, and the first insulation material film 219 may be used to form a first insulation layer. The thickness of the first insulation material film 219 may determine a thickness of the first insulation layer.

Figure 13:
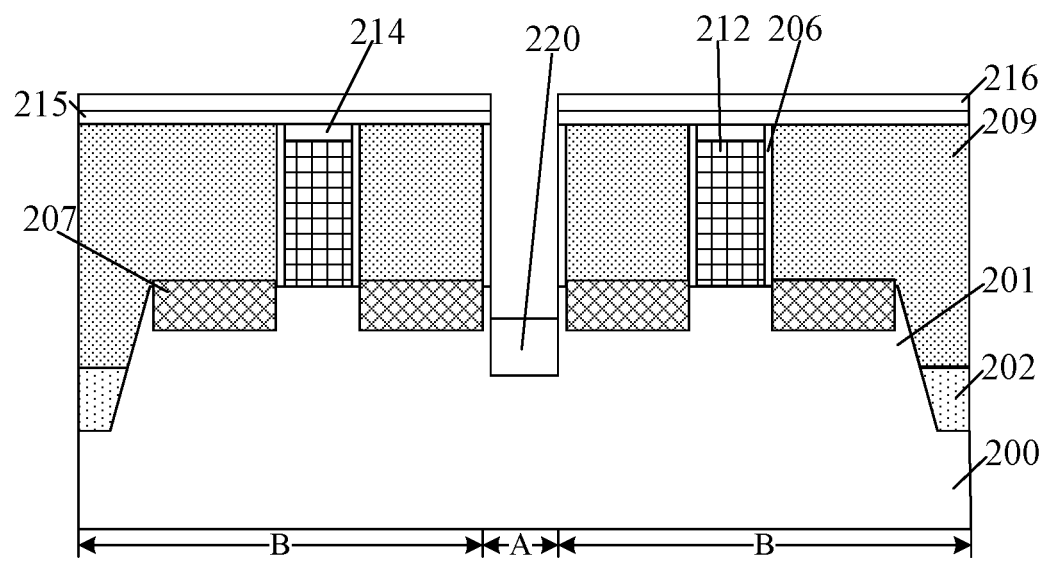

Referring to FIG. 13, a portion of the first insulation material film 219 is removed, forming a first insulation layer 220 at the bottom of the first opening 288 (see FIG. 11). A top surface of the first insulation layer 220 is lower than the top surface of the fin 201. A process of removing a portion of the first insulation material film 219 includes one or a combination of a dry etching process and a wet etching process.

A material of the first insulation layer 220 includes silicon oxide. Since the first insulation layer 220 is formed from the first insulation material film 219, and the first insulation material film 219 has a high compactness, the first insulation layer 220 may have a high compactness. Accordingly, the first insulation layer 220 may have a high isolation performance.

The first insulation layer 220 and a second insulation layer and a third insulation layer subsequently formed may be used to isolate mutual influences between the source/drain doped regions 207 at the adjacent device regions B. As such, performances of the semiconductor device may be improved.

A dimension of the first insulation layer 220 in the direction perpendicular to the surface of the substrate 200 is in a range of approximately 50 nm to about 100 nm. If the dimension of the first insulation layer 220 in the direction perpendicular to the surface of the substrate 200 is less than approximately 50 nanometers, it may be difficult to remove the first insulation material film 219. If the dimension of the first insulation layer 220 in the direction perpendicular to the surface of the substrate 200 is greater than approximately 100 nanometers, the subsequently formed second insulation layer may cover a small area of the substrate 200 at the sidewalls of the source/drain doped regions 207. Accordingly, the ability of insulation structure for isolating devices in the adjacent device regions B may be weak, and thus the devices in the adjacent device areas B may interfere with each other.

In one embodiment, the top surface of the first insulation layer 220 is lower than the top surface of the fin 201, and thus the second insulation layer and the third insulation layer may be subsequently formed on the surface of the first insulation layer 220. In some other embodiments, the first insulation layer 220 may fully fill the first opening, the second opening, and the third opening.

Figure 14:
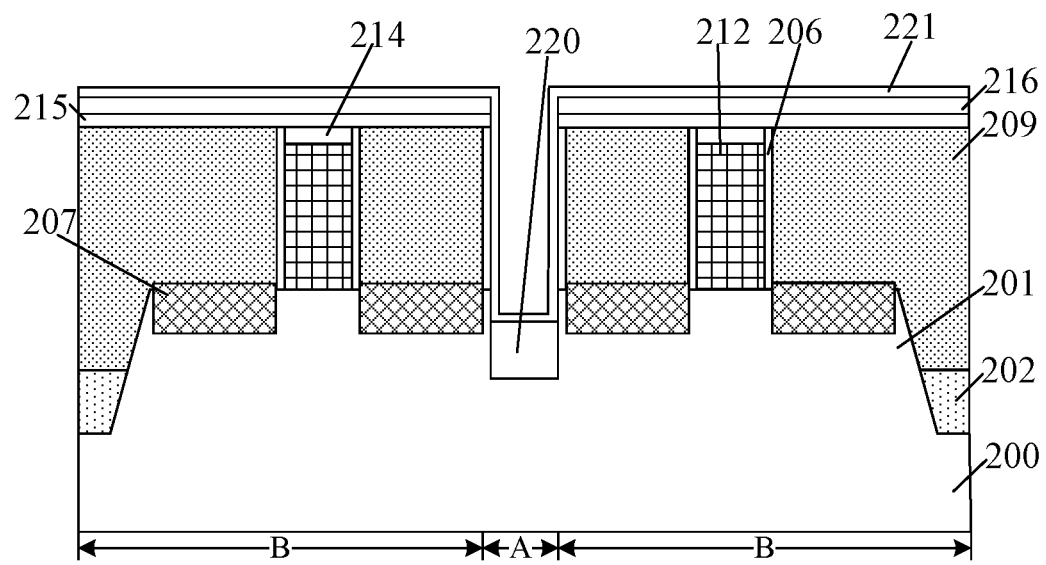

Referring to FIG. 14, a second insulation layer 221 may be formed on surfaces of the third stop layer 216 and the first insulation layer 220, and sidewalls of the third opening 270 (see FIG. 11), the second opening 218 (see FIG. 11), and the first opening 288 (see FIG. 11). A process of forming the second insulation layer 221 includes a chemical vapor deposition process or a physical vapor deposition process.

The second insulation layer 221 covers a portion of the sidewalls of the first opening 288, the second opening 218, and the third opening 288. A material of the second insulation layer 221 includes silicon nitride that has a high compactness. As such, the second insulation layer 221 may have a good isolation performance for devices in the adjacent device regions B. Accordingly, mutual influence between devices in the adjacent device regions B may be weak.

The second insulation layer 221, the first insulation layer 220 and a third insulation layer subsequently formed may form an insulation structure for isolating the source/drain doped regions 207 at the adjacent device regions B.

In one embodiment, in the direction perpendicular to the sidewalls of the gate structures 212, the second insulation layer 221 has a dimension in a range of approximately 3 nm to 9 nm. If the dimension of the second insulation layer 221 is less than approximately 3 nanometers in the direction perpendicular to the sidewalls of the gate structures 212, the second insulation layer 221 may not have sufficient isolation capability for devices in the adjacent device regions B. If the dimension of the second insulation layer 221 is greater than approximately 9 nanometers in the direction perpendicular to the sidewalls of the gate structures 212, a process of forming the second insulation layer 221 may be difficult.

In some other embodiments, the second insulation layer is not formed, and the first insulation layer and a subsequent third insulation layer fully fill the first opening, the second opening, and the third opening. In some other embodiments, the second insulation layer is formed, and the second insulation layer fully fills the first opening, the second opening, and the third opening.

Figure 15:
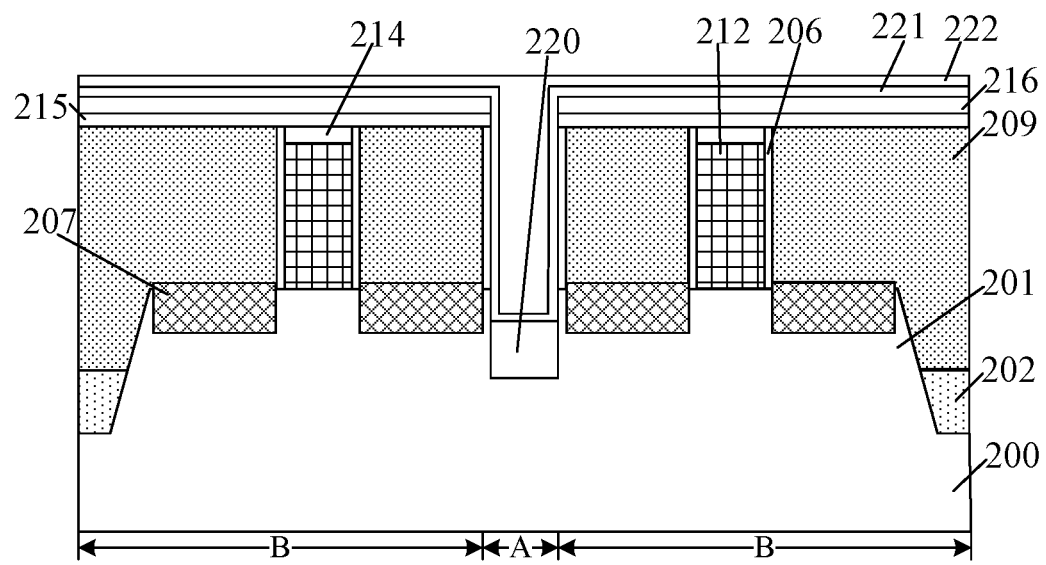

Referring to FIG. 15, a third insulation layer 222 is formed on a surface of the second insulation layer 221. A top surface of the third insulation layer is flush with or higher than the top surfaces of the source/drain doped regions 207. A material of the third insulation layer 222 includes silicon oxide, and a process of forming the third insulation layer 222 includes a fluid chemical vapor deposition process or a physical vapor deposition process.

In the direction perpendicular to the surface of the substrate 200, the third insulation layer 222 has a dimension in a range of approximately 40 nm to about 90 nm. If the dimension of the third insulation layer 222 in the direction perpendicular to the surface of the substrate 200 is less than approximately 40 nm, it may be difficult for the third insulation layer 222 to fully fill the first opening 288, the second opening 218 and the third opening 270. If the dimension of the third insulation layer 222 in the direction perpendicular to the surface of the substrate 200 is greater than approximately 90 nm, it may be difficult to remove the third insulation layer 222 on the top of the third stop layer 216 in a subsequent process.

The insulation structure includes the first insulation layer 220, the second insulation layer 221, and the third insulation layer 222. In one embodiment, the insulation structure fully fills the first opening 288, the second opening 218, and the third opening 270. In some other embodiments, the insulation structure does not fully fill the second opening and the third opening. That is, the top of the insulation structure may be flush with or above the top surfaces of the source/drain doped regions.

Since the top surface of the insulation structure may be flush with or higher than the top surfaces of the source/drain doped regions 207, the insulation structure may isolate the source/drain doped regions 207 at the adjacent device regions B. Moreover, since a dimension of the insulation structure along a direction connecting the source/drain doped regions 207 at the adjacent device regions B is large, the insulation structure may have a strong ability in isolating the source/drain doped regions 207 at the adjacent device regions B. Accordingly, the interaction between devices in the adjacent device regions B may be weak.

Figure 16:
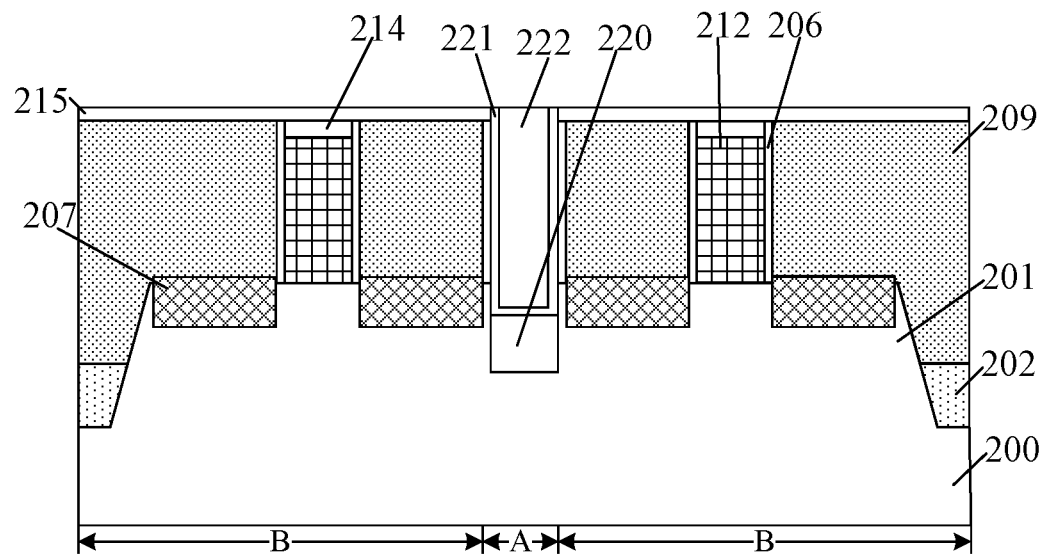

Referring to FIG. 16, a portion of the third insulation layer 222 is removed until the second insulation layer 221 is exposed. After the second insulation layer 221 is exposed, a portion of the second insulation layer 221 and the third stopping layer 216 are removed until the top surface of the first stop layer 215 is exposed.

Since a portion of the third insulation layer 222 is removed, the second insulation layer 221 may be exposed, and thus a portion of the second insulation layer 221 may be subsequently removed.

A process of removing a portion of the third insulation layer 222 includes one or a combination of a dry etching process and a wet etching process. The process of removing a portion of the second insulation layer 221 and the third stop layer 216 includes one or a combination of a dry etching process and a wet etching process.

The first insulation layer 220, the second insulation layer 221, and the third insulation layer 222 constitute the insulation structure (not labelled). Since the top surface of the insulation structure is flush with or higher than the top surfaces of the source/drain doped regions 207, the insulation structure may isolate the source/drain doped regions 207 at the adjacent device regions B. Moreover, since the insulation structure has a large dimension in the direction perpendicular to the sidewalls of the gate structures 212, the insulation structure may have a strong ability in isolating the source/drain doped regions 207 at the adjacent device regions B. Accordingly, mutual influences between devices at the adjacent region devices B may be weak, and thus the performance of the semiconductor device may be improved.

After the insulation structure is formed, the fabrication process may also include forming a second dielectric layer on the first stop layer 215 and the surface of the insulation structure. The fabrication process may also includes removing a portion of the second dielectric layer, the first stop layer 215 and the second stop layer 214, until the top surfaces of the gate structures 212 are exposed, thus forming a first contact hole in the second dielectric layer and the first stop layer 215. The fabrication process may also include forming a first plug in the first contact hole.

The fabrication process may also include removing a portion of the second dielectric layer, the first stop layer 215, and the first dielectric layer 209 until the top surfaces of the source/drain doped regions 207 are exposed, thus forming a second contact hole in the second dielectric layer, the first stop layer 215, and the first dielectric layer 209. The fabrication process may also include forming a second plug in the second contact hole.

In one embodiment, the first stop layer 215 is not removed. The first stop layer 215, the first dielectric layer 209 and the second dielectric layer may be used to achieve electrical isolation between semiconductor devices. In some other embodiments, the fabrication process may also include removing the first stop layer.

The present disclosure also provides a semiconductor structure. As shown in FIG. 16, the semiconductor structure includes a substrate 200 with a fin 201 on its surface. The substrate 200 includes an isolation region A and two device regions B located at two sides of the isolation region A respectively, and the device regions B are adjacent to the isolation region A. The semiconductor structure also includes gate structures 212 across the fin 201 at the device regions B. The fin 201 at two sides of each gate structure 212 has source/drain doped regions 207. The semiconductor structure also includes a first opening 288 (see FIG. 11) in the fin 201 at the isolation region A, and two opposite sidewalls of the first opening 288 are respectively in contact with the source/drain doped regions 207 at the adjacent device regions B. The semiconductor structure further includes an insulation structure located in the first opening 288, and a top surface of the insulation structure is flush with or higher than the top surfaces of the source/drain doped regions 207.

In the direction perpendicular to the sidewalls of the gate structures 212, the first opening 288 has a dimension in a range of approximately 20 nm to 34 nm. The first opening 288 has a depth in a range of approximately 50 nm to 100 nm.

The semiconductor structure also includes a first dielectric layer 209 on top surfaces of the isolation structures 202 and the source/drain doped regions 207, sidewalls and the top surface of the fin 201, and sidewalls of the gate structures 212. The semiconductor structure also includes a second opening 218 (see FIG. 11) in the first dielectric layer 209, wherein the second opening 218 is located at top of the first opening 288. The insulation structure includes a first insulation layer 220 at the bottom of the first opening 288. A top surface of the first insulation layer 220 is lower than the top surface of the substrate 200. The insulation structure also includes a second insulation layer 221 that is located on the top surface of the first insulation layer 220, and covers the sidewalls of the first opening 288 and the second opening 218. The insulation structure also includes a third insulation layer 222 on the surface of the second insulation layer 221. The first insulation layer 220, the second insulation layer 221 and the third insulation layer 222 fully fills the first opening 288 and second opening 218.

A material of the first insulation layer 220 includes silicon oxide. A material of the second insulation layer 221 includes silicon nitride. A material of the third insulation layer 222 includes silicon oxide.

A dimension of the first insulation layer 220 in the direction perpendicular to the surface of the substrate 200 is in a range of approximately 50 nm to 100 nm. A dimension of the second insulation layer 221 in a direction perpendicular to the sidewalls of the gate structures 212 is in a range of approximately 3 nm to 9 nm. A dimension of the third insulation layer 222 in the direction perpendicular to the surface of the substrate 200 is in a range of approximately 40 nm to 90 nm.

As disclosed, the technical solutions of the present disclosure have the following advantages.

In the fabrication process of a semiconductor structure provided by the technical solutions of the present disclosure, two sides of a sacrificial gate are respectively in contact with source/drain doped regions at adjacent device regions, and the sacrificial gate may define a position of a first opening. Since the first opening accommodates an insulation structure, two sides of the insulation structure are respectively in contact with the source/drain doped regions of the adjacent device regions. Moreover, since a top surface of the insulation layer is flush with or higher than top surfaces of the source/drain doped regions, the insulation structure may isolate the source/drain doped regions at the adjacent device regions. In addition, since the insulation structure has a large dimension along a direction connecting the source/drain doped regions at the adjacent device regions, the insulation structure may have a strong ability in isolating the source/drain doped regions at the adjacent device regions. Accordingly, a device formed may have good performances.

Further, when a material of the gate film is metal, a first dielectric layer may be formed, covering top surfaces of the substrate and the source/drain doped regions, sidewalls and top surface of the fin, and sidewalls of the gate structures and the sacrificial gate. Before a first opening is formed, the sacrificial gate is removed, and a second opening is formed in the first dielectric layer. Since the insulation structure also fills the second opening, the insulation structure may have a strong ability of isolating the source/drain doped regions at the adjacent device regions.

Further, the insulation structure includes a first insulation layer and a third insulation layer. Materials of the first insulation layer and the third insulation layer include silicon oxide, and a process of forming the first insulation layer and the third insulation layer includes a fluid chemical vapor deposition process. The first insulation layer and third insulation layer formed by the fluid chemical vapor deposition process may have a strong filling ability to the first opening and the second opening, and thus the first insulation layer and the third insulation layer may have a high compactness. Accordingly, the insulation structure may have a strong ability in isolating devices in the adjacent device regions.

Furthermore, after the first insulation layer is formed and before the third insulation layer is formed, the fabrication process further comprises forming a second insulation layer on top surface of the first insulation layer and sidewalls of the first opening and the second opening. A material of the second insulation layer includes silicon nitride. A high compactness of silicon nitride may improve the ability of the insulation structure in isolating devices at the adjacent device regions.

The embodiments disclosed herein are exemplary only and not limiting the scope of this disclosure. Various combinations, alternations, modifications, or equivalents to the technical solutions of the disclosed embodiments can be obvious to those skilled in the art and can be included in this disclosure. Without departing from the spirit and scope of this invention, such other modifications, equivalents, or improvements to the disclosed embodiments are intended to be encompassed within the scope of the present disclosure.

What is claimed is:

1. A semiconductor structure, comprising:
   a substrate including device regions and an isolation region located adjacent to and between the device regions;
   a fin on the substrate;
   gate structures across the fin at the device regions;
   source/drain doped regions in the fin at two sides of each of the gate structures;
   a first opening in the fin at the isolation region;
   an insulation structure located in the first opening, the insulation structure including a first insulation layer at a bottom of the first opening, a second insulation layer on a top surface of the first insulation layer and sidewall surfaces of the first opening, and a third insulation layer on a top surface and sidewall surfaces of the second insulation layer, the first insulation layer and the third insulation layer being made of a first material, and the second insulation layer being made of a second material different from the first material;
   isolation structures disposed at the device region and on a top surface of the substrate at two sides of the fin, top surfaces of the isolation structures being lower than a top surface of the fin, and the isolation structures covering a portion of sidewalls of the fin; and
   a first dielectric layer on top surfaces of the source/drain doped regions, the sidewalls and the top surface of the fin, the top surfaces of the isolation structures, and sidewalls of the gate structures;
   wherein:
   two opposite sidewalls of the first opening are respectively in contact with the source/drain doped regions at adjacent device regions;
   a top surface of the insulation structure is flush with or higher than the top surfaces of the source/drain doped regions;
   a top surface of the third insulation layer is higher than top surface of the first dielectric layer, and the top surfaces of the first dielectric layer are higher than top surfaces of the gate structures;
   the top surface of the first insulation layer is higher than bottom surfaces of the source/drain doped regions and is lower than the top surfaces of the source/drain doped regions, and a thickness of the first insulation layer along a vertical direction is uniform; and
   the top surface of the first insulation layer is higher than the top surfaces of the isolation structures, and a bottom surface of the first insulation layer is higher than bottom surfaces of the isolation structures.

2. The semiconductor structure according to claim 1, wherein the first opening has a dimension in the direction perpendicular to the sidewalls of the gate structures in a range of approximately 20 nm to 34 nm.

3. The semiconductor structure according to claim 1, wherein the first opening has a depth in a range of approximately 50 nm to 100 nm.

4. The semiconductor structure according to claim 1, wherein:
   the semiconductor structure also includes a second opening in the first dielectric layer, wherein the second opening is located on a top of the first opening, and
   the third insulation layer fully fills the first opening and the second opening.

5. The semiconductor structure according to claim 1, wherein:
   the first material includes silicon oxide,
   the first insulation layer has a dimension in a direction perpendicular to the surface of the substrate in a range of approximately 50 nm to 100 nm, and
   the third insulation layer has a dimension in the direction perpendicular to the surface of the substrate in a range of approximately 40 nm to 90 nm.

6. The semiconductor structure according to claim 4, wherein:
   the second insulating layer covers sidewalls of the second opening, the second material includes silicon nitride, and the second insulation layer has a dimension in the direction perpendicular to the sidewalls of the gate structures in a range of approximately 3 nm to 9 nm.

7. The semiconductor structure according to claim 1, wherein:

the isolation structure is made of a material including silicon oxide, silicon oxynitride, or a low-K dielectric material with K less than approximately 3.9.

8. The semiconductor structure according to claim 4, further comprising:

a second dielectric layer on surfaces of the first dielectric layer, the gate structures, and the insulation structure.

9. The semiconductor structure according to claim 8, further comprising:

a first plug in the second dielectric layer on the top surfaces of the gate structures; and second plugs through the first dielectric layer and the second dielectric layer on the top surfaces of the source/drain doped regions.

10. The semiconductor structure according to claim 1, wherein a bottom surface of the first opening is lower than the bottom surfaces of the source/drain doped regions.

* * * * *